United States Patent
Mu et al.

(10) Patent No.: US 8,995,202 B2
(45) Date of Patent: Mar. 31, 2015

(54) TEST FLOW TO DETECT A LATENT LEAKY BIT OF A NON-VOLATILE MEMORY

(75) Inventors: Fuchen Mu, Austin, TX (US); Paul A Bogucki, Austin, TX (US); Chen He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 343 days.

(21) Appl. No.: 13/476,711

(22) Filed: May 21, 2012

(65) Prior Publication Data

US 2013/0308402 A1    Nov. 21, 2013

(51) Int. Cl.
*G11C 11/34* (2006.01)
*G11C 29/50* (2006.01)

(52) U.S. Cl.
CPC .... *G11C 29/50004* (2013.01); *G11C 29/50016* (2013.01); *G11C 2029/5006* (2013.01)
USPC ............. 365/185.22; 365/185.18; 365/185.29

(58) Field of Classification Search
USPC .................. 365/210, 185.18, 185.29, 185.22
See application file for complete search history.

(56) References Cited

U.S. PATENT DOCUMENTS

| | | | |
|---|---|---|---|
| 6,480,415 B2 * | 11/2002 | Makuta et al. | 365/185.09 |
| 6,967,873 B2 | 11/2005 | Hamilton et al. | |
| 7,180,781 B2 | 2/2007 | Abedifard et al. | |
| 7,558,122 B2 | 7/2009 | Kim et al. | |
| 7,957,198 B2 * | 6/2011 | Yip | 365/185.22 |
| 8,139,421 B2 * | 3/2012 | Mihnea et al. | 365/185.29 |
| 2003/0021155 A1 | 1/2003 | Yachareni et al. | |
| 2013/0279257 A1 | 10/2003 | Costa et al. | |
| 2006/0083073 A1 | 4/2006 | Ueda | |
| 2006/0114733 A1 | 6/2006 | Hosono | |
| 2011/0242901 A1 | 10/2011 | Marquart | |

FOREIGN PATENT DOCUMENTS

| | | |
|---|---|---|
| WO | 02082447 A2 | 10/2002 |
| WO | 02095762 A2 | 11/2002 |

OTHER PUBLICATIONS

U.S. Appl. No. 13/647,951, filed Oct. 9, 2012, entitled "Latent Slow Bit Detection for Non-Volatile Memory".
U.S. Appl. No. 13/474,504, filed Jan. 23, 2013, entitled Dynamic Detection Method for Latent Slow-to-Erase Bit for High Performance and High Reliabilty Flash Memory.
Notice of Allowance mailed May 1, 2014 in U.S. Appl. No. 13/747,504; 12 pages.
Notice of Allowance mailed Sep. 23, 2014 for U.S. Appl. No. 13/647,951, 16 pages.

* cited by examiner

*Primary Examiner* — Son Dinh (57) ABSTRACT

A technique for detecting a leaky bit of a non-volatile memory includes erasing cells of a non-volatile memory. A bias stress is applied to the cells subsequent to the erasing. An erase verify operation is performed on the cells subsequent to the applying a bias stress to the cells. Finally, it is determined whether the cells pass or fail the erase verify operation based on whether respective threshold voltages of the cells are below an erase verify level.

22 Claims, 5 Drawing Sheets

TEST FLOW TO DETECT A LATENT LEAKY BIT OF A NON-VOLATILE MEMORY

BACKGROUND

1. Field

This disclosure relates generally to non-volatile memory and, more specifically, to test flows to detect a latent leaky bit of a non-volatile memory.

2. Related Art

Non-volatile memory (NVM) is memory that retains stored information when unpowered. Examples of NVM include read-only memory (ROM), flash memory, ferro-electric random access memory (FRAM), and magneto-resistive random access memory (MRAM). NVM, similar to volatile memory, may have cells (bits) that exhibit leaky behavior. For example, an NVM cell that was programmed to a digital one may transition over time to a digital zero. As another example, an NVM cell that was programmed to a digital zero may transition over time to a digital one. Conventional NVM test flows have not generally screened out latent leaky cells (bits) that only transition after a number of cycles (e.g., several hundred cycles) or transition after a certain number of cycles and stop and then transition again after another number of cycles. Consequently, latent leaky bits may cause NVM (e.g., flash memory) qualification failures and result in customer returns of an NVM unit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents.

In one conventional NVM test flow, a burn-in (BI) program/erase (P/E) cycling test is employed to screen out bad NVM units whose cycling performance deteriorates to a certain level (e.g., when an erase pulse count exceeds a screen limit). It is common for units with latent leaky bits to show leaky behavior only after a number of cycles. When latent leaky bits occur, an erase pulse count may not necessarily increase to a screen limit (even though the bits will likely cause an erase or program operation to eventually fail). In known NVM test flows, stresses (e.g., drain stresses and gate stresses) have been applied to an NVM unit. However, the applied stresses have been decoupled from P/E cycling. That is, stresses are either applied before P/E cycling or after P/E cycling. In general, the efficiency of an applied stress during conventional NVM test flows may be limited since the applied stress depends on a threshold voltage (Vt) level of a cell (bit) before the applied stress, which varies from cycle-to-cycle. Moreover, some latent leaky bits show erratic behavior, i.e., their leakage varies from cycle to cycle, which makes it even harder to detect latent leaky bits with conventional NVM test flows.

As used herein, the term 'latent leaky bit' means a bit (cell) of a non-volatile memory (NVM) that eventually changes state from a programmed state to a non-programmed state or from a non-programmed state to a programmed state (i.e., flips from a digital zero to a digital one or flips from a digital one to a digital zero). As is also used herein the term 'fast move bit' or 'extrinsic bit' is synonymous with the term 'latent leaky bit'. It should be appreciated that all cell threshold voltages will eventually move if a large enough drain bias is applied to the cells for a long enough period of time. As may be used herein, the term 'coupled' includes a direct electrical connection between elements or components and an indirect electrical connection between elements or components achieved using one or more intervening elements or components.

With device geometry scaling down, NVM cells are expected to receive more program/erase (P/E) cycles and be subjected to harsher operating temperatures. For example, for 55 nanometer technology, certain memory blocks are expected to receive 250 k cycles (as compared to 100 k cycles for 90 nanometer technology) and maximum ambient temperatures of around 175 degrees Celsius are anticipated. Under these conditions, it is believed that the NVM latent leaky bit problem will become more common As such, it is highly desirable to effectively screen out NVM units with latent leaky bits prior to deployment into the field. According to the present disclosure, a test flow is disclosed that generally improves reliability and performance of NVMs to achieve relatively low customer quality incident (CQI) and parts per million (PPM) failures. The disclosed NVM test flows for detecting latent leaky bits can also be provided as a user test mode diagnostic feature to address customer requests for user test mode diagnostics to identify potential imminent failure situations in an attempt to achieve zero defects.

According to one or more embodiments of the present disclosure, a bias stress (e.g., a drain stress, a gate stress, or both drain and gate stresses) is periodically applied (e.g., once per ten cycles) during BI cycling for a short period of time. After the bias stress, a dynamic erase verify at the normal erase verify level plus a predetermined delta voltage is employed to detect fast move bits of an NVM. If fast move bits are detected, an NVM unit is screened out as a test failure. In general, the disclosed techniques may efficiently be incorporated as an in-line test within a BI environment. Moreover, NVM units may be tested multiple times with different cycles (e.g., ten cycles, fifty cycles, one-hundred cycles), which is generally more efficient at detecting latent leaky bits, as compared with known NVM test flows. As noted above, the disclosed NVM test flows can also be provided as a user test mode diagnostics feature. In this case, during the NVM lifetime of the customer application, a customer can enable the bias stress feature and use dynamic erase verify to detect fast move bits as desired. Following user test mode diagnostics, an NVM may be erased to reset the NVM to a known good state.

According to the present disclosure, latent leaky bits are detected by periodically applying (e.g., once per ten cycles) a bias stress (e.g. a drain stress, a gate stress, or both stresses), for a short period of time (e.g., 10 milliseconds) during BI cycling. After bias stress, a dynamic erase verify approach may be employed to detect NVM units with fast move bits. The NVM units with fast move bits may then be screened out. As NVM units may be tested multiple times with different cycles, detection of latent leaky bits according to the present disclosure is generally more efficient than known NVM test flows.

In various embodiments, a predetermined bias stress is applied at a readout cycle during BI or during in-field user diagnostics. An erase margin read verify may then be performed subsequent to the applied bias stress to determine if there are any extrinsic bits (i.e., bits that fail the erase margin read or equivalently bits with threshold voltage above the erase margin read level). In the event extrinsic bits are detected after the bias stress, failing NVM units are screened.

According to one or more embodiments of the present disclosure, a technique for detecting a leaky bit of a non-volatile memory includes erasing cells of a non-volatile memory. A bias stress is applied to the cells subsequent to the erasing. An erase verify operation is performed on the cells subsequent to the applying a bias stress to the cells. Finally, it is determined whether the cells pass or fail the erase verify operation based on whether respective threshold voltages of the cells are below an erase verify level.

Figure 1:
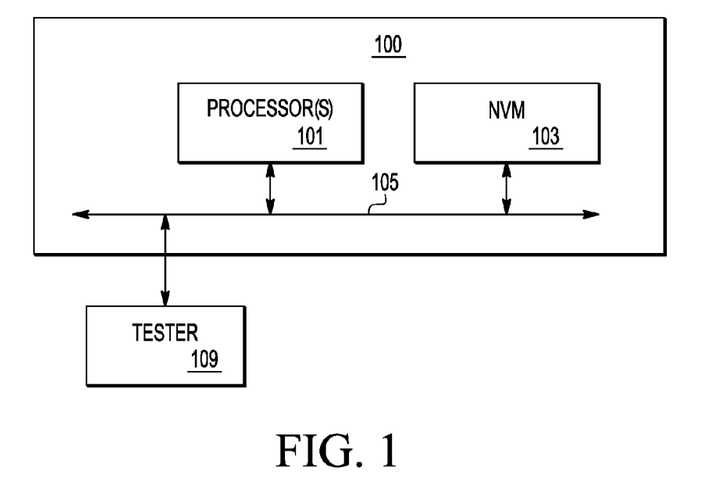
FIG. 1 is a block diagram of a relevant portion of an integrated circuit that includes an exemplary non-volatile memory (NVM) configured according to one embodiment of the present invention.

With reference to FIG. 1, a block diagram of an exemplary system 100 includes a non-volatile memory (NVM) 103 that is configured according to the present disclosure. In the illustrated embodiment, the system 100 may, for example, implement a system on a chip (SoC) that includes at least one processor 101 coupled to the NVM 103 via an appropriate bus (interface) 105. As is illustrated, the NVM may be coupled to an external tester 109. The tester 109, the processor 101, and/or other circuitry (e.g., implemented within NVM 103) may initiate the disclosed NVM test flow on the NVM 103. The system 100 may include other circuits, modules or devices, such as other memory devices (not shown), other functional modules (not shown), and external interfaces, such as input, output or input/output (I/O) ports or pins (not shown). The NVM 103 may be integrated in a single integrated circuit with the processor 101 and the bus 105, or the components may be implemented within different integrated circuits that are in communication.

Figure 2:
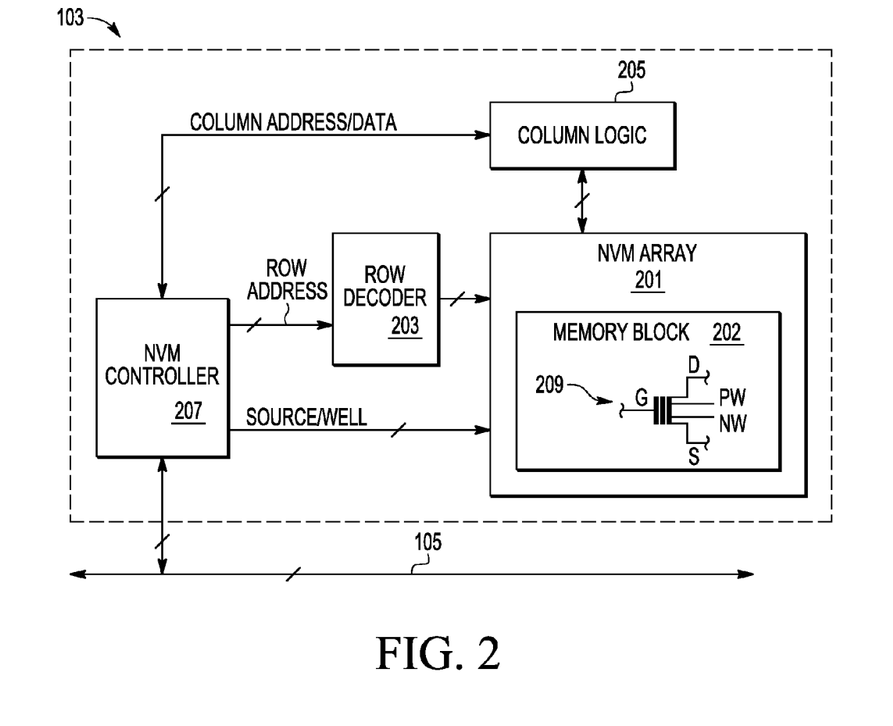
FIG. 2 is a more detailed block diagram of the exemplary NVM of FIG. 1.

FIG. 2 is a more detailed block diagram of the NVM 103 coupled to the bus 105. As is shown, the NVM 103 includes an NVM array 201, a row decoder 203 coupled to the NVM array 201, column logic 205 coupled to the NVM array 201, and a memory controller 207 coupled to the interface 105, the column logic 205, and the row decoder 203. In a typical embodiment, the column logic 205 incorporates a column decoder and sense amplifiers (not shown). The memory controller 207 controls operation of the NVM array 201 through the row decoder 203 and the column logic 205, such as in response to the processor 101 as communicated through the bus 105. The memory controller 207 accesses memory cells within the NVM array 201 by providing a row address to the row decoder 203 (to generate word line signals) and a column address to the column logic 205. Data is written into or read from the NVM array 201 via the column logic 205. The memory controller 207 also drives source and well voltages (via corresponding switches and controllers, not shown) to the NVM array 201. The NVM array 201 incorporates one or more blocks of memory cells in which each memory block has a selected block size, such as, for example, 16 kilobytes (kB), 32 kB, 64 kB, 128 kB, 256 kB, etc. As shown, the NVM array 201 includes at least one memory block 202.

The memory block 202 of the NVM array 201 is illustrated with an exemplary memory cell 209, which includes a gate (G) terminal, a drain (D) terminal, and a source (S) terminal along with isolated wells including a p-type well (PW) and an n-type well (NW). In one embodiment, each memory block is organized as an array into rows and columns of the memory cells 209. The gate terminal of each row of memory cells 209 is coupled to a corresponding one of multiple wordlines coupled to the row decoder 203. The drain terminal of each column of memory cells 209 is coupled to a corresponding one of multiple bit lines coupled to the column logic 205. The source terminal and wells (PW and NW) of each memory cell 209 are driven or controlled by the memory controller 207. In one embodiment, the memory controller 207 drives individual voltage levels to PW and NW. In other embodiments, other types of memories may have other types of components and/or other types of memory cells, etc.

Figure 3:
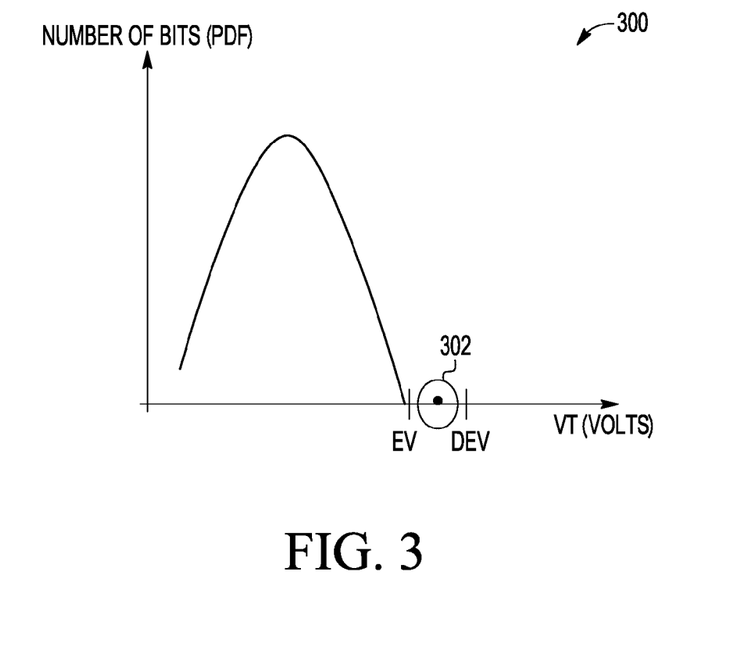
FIG. 3 is an exemplary graph of a probability density function (PDF) of bits in an NVM block after an erase operation with a single extrinsic/leaky bit observed following a conventional NVM test flow.

With reference to FIG. 3, an exemplary probablity density function (PDF) graph 300 (of bits in an NVM block after an erase operation fails) is illustrated. The graph 300 depicts a threshold voltage (Vt) distribution of the NVM block without bias stress with a single extrinsic bit 302 being observed. That is, only the single extrinsic bit 302 is observed following an erase operation without bias stress in a conventional NVM test flow. It should be noted that all of the bits in an NVM block after a passing erase operation will have a threshold voltage below the normal erase verify (EV) level, e.g., 3.5V. The threshold voltage (Vt) of the extrinsic bit 302 is above the normal erase verify (EV) level, which caused the erase operation to fail, but is below a delta erase verify (DEV) level, i.e., the normal erase verify level plus a predetermined delta voltage, e.g., 200 millivolts. Thus without bias stress, the extrinsic bit 302 would pass the delta erase verify.

Figure 4:
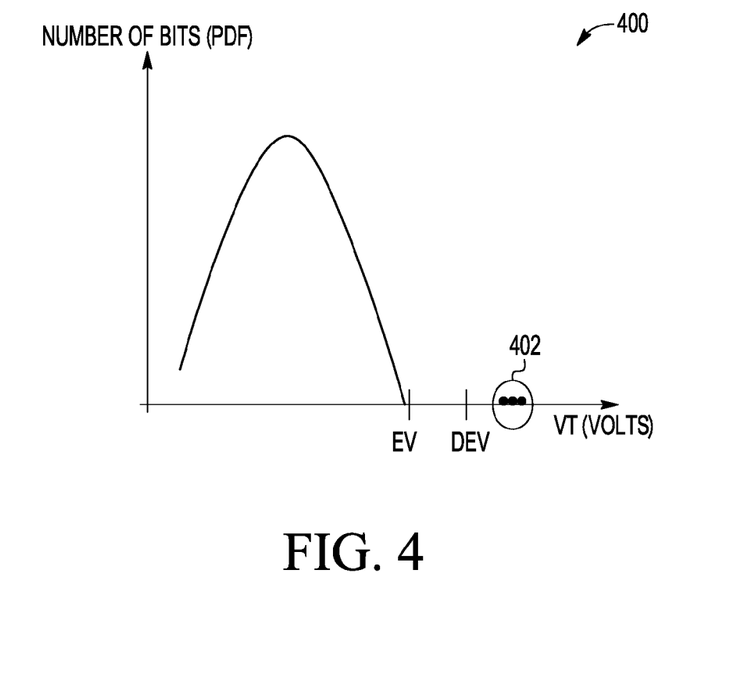
FIG. 4 is an exemplary graph of a PDF of bits in the same NVM block as shown in FIG. 3 after an erase operation followed by drain stress with multiple extrinsic/leaky bits observed following an NVM test flow according to an embodiment of the present invention that employs drain stress.

With reference to FIG. 4, an exemplary PDF graph 400 of bits in the same NVM block of FIG. 3 (after an erase operation and drain stress is observed with multiple extrinsic bits 402 following an NVM test flow according to an embodiment of the present invention that employs drain stress) is illustrated. The graph 400 depicts a threshold voltage (Vt) distribution after an erase operation followed by a drain stress applied with multiple extrinsic bits 402 being observed. It should be noted that all of the extrinsic bits 402 have a threshold voltage (Vt) above the delta erase verify (DEV) level. With reference to FIGS. 3 and 4, it should be appreciated that additional extrinsic bits after drain stress indicate the drain stress after erase operation is more effective at screening out leaky bits.

Figure 5:
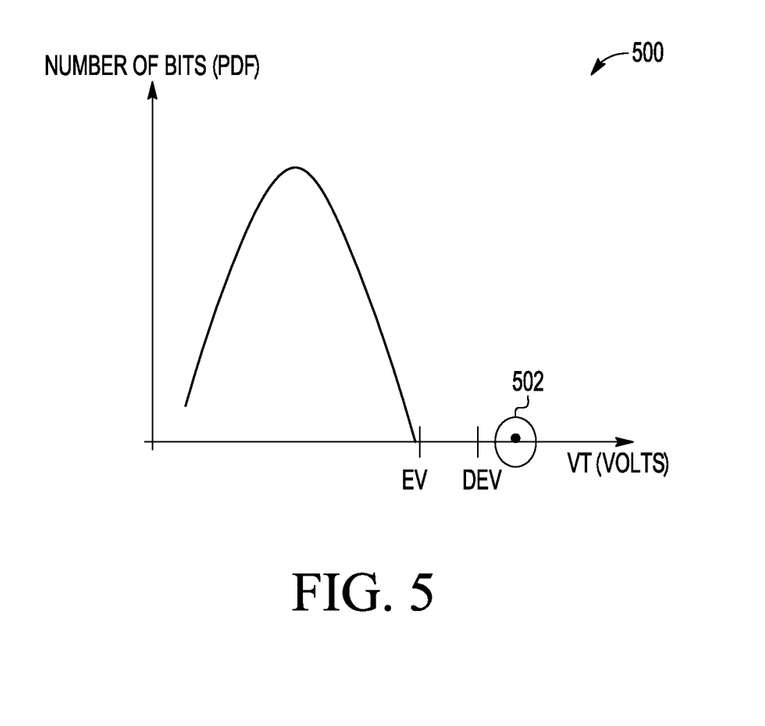
FIG. 5 is another exemplary graph of a PDF of bits in a different NVM block after an erase operation followed by drain stress with a single extrinsic bit observed following an NVM test flow according to another embodiment of the present invention that employs drain stress after an erase operation.

With reference to FIG. 5, an exemplary PDF graph 500 of bits in a different NVM block from the same NVM unit of FIG. 3 (after an erase operation followed by a drain stress is also observed with a single extrinsic bit 502 following an NVM test flow according to another embodiment of the present invention that employs drain stress) is illustrated. It should be appreciated that the NVM block did not show any extrinsic bits after an erase operation before drain stress. It should also be noted that the extrinsic bit 502 has a threshold voltage (Vt) above the delta erase verify (DEV) level. Therefore, the graph 500 depicts additional failing memory blocks with extrinsic bits following drain stress after an erase operation according to one or more embodiments of the present disclosure. For example, if the probability of missing a leaky bit is 20 percent after one bias stress, the probability of missing a leaky bit is about 0.16 percent after four readouts using the disclosed NVM test flow.

Figure 6:
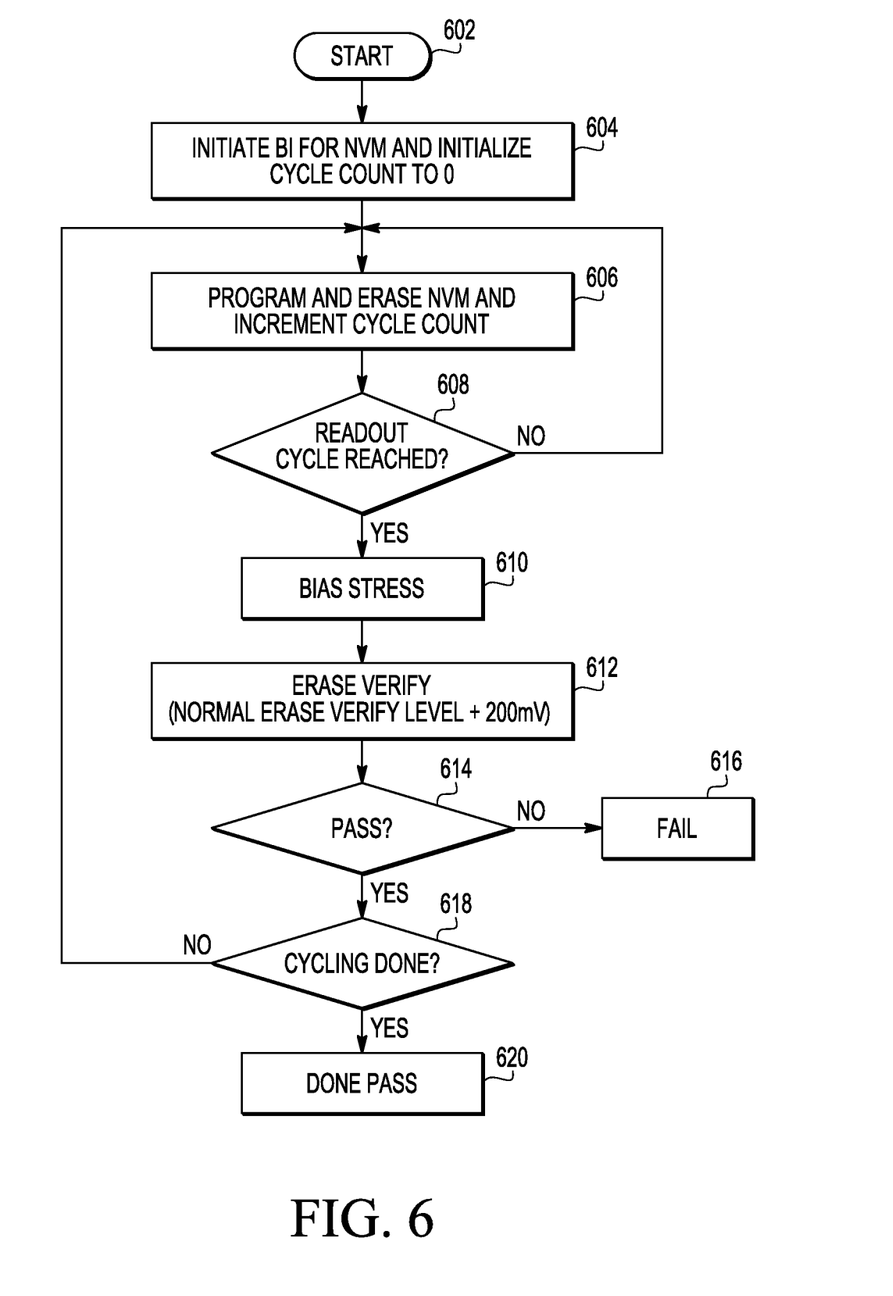
FIG. 6 is a flowchart of an exemplary burn-in (BI) test flow according an embodiment of the present invention that employs bias stress.

With reference to FIG. 6, a flowchart of an exemplary burn-in (BI) P/E cycling test flow 600 is illustrated. The test flow 600 employs bias stress according to one or more embodiments of the present disclosure. For example, the bias stress may correspond to a gate stress, a drain stress, or both gate and drain stresses. In general, a bias stress is initiated by applying a voltage to a gate or drain node of an NVM cell. As one example, an NVM may utilize a gate stress of 8.5 Volts or a drain stress of 4.2 Volts.

For example, the test flow 600 may be initiated in block 602 by the tester 109, the processor 101, and/or other circuitry. From block 602 control transfers to block 604 where BI is initiated for the NVM in which the P/E cycle count is initialized to 0. For example, BI may be performed at 125 degrees Celsius. Next, in block 606 P/E cycling of the NVM is initiated, i.e., the NVM is programmed to a specific data pattern and then erased. For example, during the programming operation, first program all the cells of the memory array to digital zero, then erase all the cells of the memory array to digital one. In general, a digital zero corresponds to high threshold voltage state (i.e., low current at given gate and drain voltages) and a digital one corresponds to low threshold voltage state (i.e., high current at given gate and drain voltages). After the program operation, in block 606, all cells are erased to the erased (digital one) state, i.e., all cells will have a threshold voltage below the normal erase verify level, e.g. 3.5V, and the P/E cycle count is incremented.

Next, in decision block 608, the tester 109, the processor 101 and/or other circuitry determines whether a readout cycle has been reached. For example, a readout may be performed every ten P/E cycles. Alternatively, readouts may be performed at different intervals. For example, a first readout may be performed at ten P/E cycles, a second readout may be performed at fifty P/E cycles, and a third readout may be performed at one-hundred fifty P/E cycles. In response to a predetermined readout cycle not being reached (e.g., when a readout is performed at fifty P/E cycles and the cycle count is less than fifty) in block 608, control loops back to block 606 to perform additional program and erase operations, i.e., P/E cycling. In response to a predetermined readout cycle being reached in block 608, control transfers to block 610. In block 610, a bias stress is temporarily applied to cells of the NVM by the tester 109, processor 101, and/or other circuitry. For example, the bias stress may be applied for ten milliseconds. As above, the bias stress may correspond to a gate stress, a drain stress, or both gate and drain stresses. As one example, an NVM may utilize a gate stress of 8.5 Volts and/or a drain stress of 4.2 Volts.

Next, in block 612 an erase verify operation is performed. For example, an erase verify operation may be performed at a delta erase verify (DEV) level, i.e., the normal erase verify (EV) level plus a predetermined delta value that is selected based on dynamic production data. As one example, a normal erase verify level may correspond to 3.5 volts and a delta value may correspond to 200 millivolts. Next, in block 614, the tester 109, the processor 101, and/or other circuitry determines whether the NVM passed the erase verify operation. In response to the NVM failing the erase verify operation in block 614 (i.e., the threshold voltage of the cells of the NVM are not all below the erase verify level), control passes to block 616 where the NVM is screened to a fail bin. In response to the NVM passing the erase verify operation in block 614 (i.e., the threshold voltage of the cells of the NVM are all below the erase verify level), control passes to decision block 618 where the tester 109, the processor 101, and/or other circuitry determines whether P/E cycling is complete by checking the P/E cycle count. In response to P/E cycling not being complete in block 618, control transfers to block 606 where P/E cycling is continued. In response to P/E cycling being complete in block 618, control transfers to block 620 where the NVM is screened to a pass bin.

Figure 7:
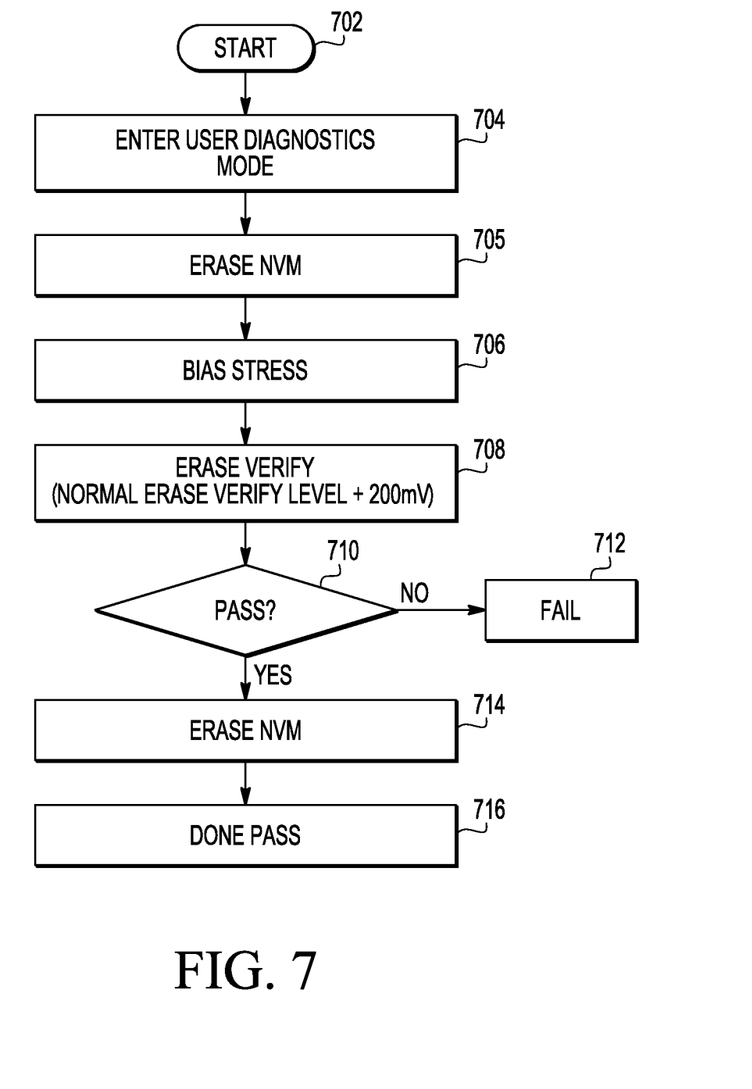
FIG. 7 is a flowchart of an exemplary user diagnostic test flow according to another embodiment of the present invention that employs bias stress.

With reference to FIG. 7, a flowchart of a user diagnostic test flow 700 is illustrated. The test flow 700 employs bias stress according to one or more embodiments of the present disclosure. For example, the bias stress may correspond to a gate stress, a drain stress, or both gate and drain stresses. In general, a bias stress is initiated by applying a voltage to a node of an NVM cell that is greater in value that a voltage that is normally applied to the node. As one example, an NVM may utilize a gate stress of 8.5 Volts or a drain stress of 4.2 Volts.

For example, the test flow 700 may be initiated in block 702 by the processor 101. From block 702 control transfers to block 704 where user diagnostics mode is entered. At block 704 the NVM may contain arbitrary data depending upon the user's application. Then control transfers to block 705 where the NVM is erased. After the erase operation passes, all the bit cells should have threshold voltages below the normal erase verify level.

Next, in block 706, a bias stress is temporarily applied to cells of the NVM by the processor 101. For example, the bias stress may be applied for 10 milliseconds. Next, in block 708 an erase verify operation is performed. For example, an erase verify operation may be performed at a delta erase verify (DEV) level, i.e., the normal erase verify (EV) level plus a delta value that is selected based on production data. As one example, a normal erase verify level may correspond to 3.5 Volts and a delta value may correspond to 200 millivolts. Next, in block 710, the processor 101 determines whether the NVM passed the erase verify operation (i.e., determining whether the threshold voltage of the cells is above/below a predetermined value following the cells being erased). In response to the NVM failing the erase verify operation in block 710 (i.e., the threshold voltage of the cells of the NVM are not all below the erase verify level), control passes to block 712 where a failure for the NVM is indicated (e.g., displayed on a display). In response to the NVM passing the erase verify operation in block 710 (i.e., the threshold voltage of the cells of the NVM are all below the erase verify level), control passes to block 714, where the processor 101 and/or other circuitry again initiates an erase operation of the NVM unit to reset the bit cells to the erased state. Following block 714, control passes to block 716 where a pass indication is returned from the processor 101.

The disclosed NVM test flows generally improve NVM field endurance by removing NVM units with latent leaky bits. In this manner, the disclosed test flows improve various NVM field reliability aspects, e.g. data retention, operating lifetime, program disturb, read disturb, etc. by screening out NVM units with latent leaky bits. In general, the disclosed NVM test flows reduce test time by screening out NVM units with latent leaky bits and reduces the occurrence of error-correction code (ECC) corrections while extending product lifetimes, facilitating zero defects and process improvement and reducing CQI and PPM failures. Also, as noted above, the disclosed NVM test flows can also be provided as a user test mode diagnostic feature to identify potential imminent failure situations for zero defects. The disclosed NVM test flows are applicable to various NVM technologies (e.g., floating gate (FG) and thin-film-storage (TFS)) and are independent of NVM technology generations.

As will be appreciated, the processes in various embodiments of the present invention may be implemented using any combination of executed software, firmware or hardware. As a preparatory step to practicing the invention in software, code (whether software or firmware) according to a preferred embodiment will typically be stored in one or more machine readable storage mediums such as semiconductor memories such as read-only memories (ROMs) such as NVMs, programmable ROMs (PROMs), etc., thereby making an article of manufacture in accordance with the invention. The article of manufacture containing the code is used by either executing the code directly from the storage device or by copying the code from the storage device into another storage device such as a random access memory (RAM), etc. An apparatus for practicing the techniques of the present disclosure could be one or more communication devices.

Although the invention is described herein with reference to specific embodiments, various modifications and changes can be made without departing from the scope of the present invention as set forth in the claims below. For example, the techniques disclosed herein are generally broadly applicable to systems that facilitate data communication. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of detecting a leaky bit in a non-volatile memory, comprising:
   erasing cells of a memory array of the non-volatile memory to a first state;
   programming the cells to a second state prior to the erasing;
   applying a bias stress to the cells subsequent to the erasing;
   performing an erase verify operation on the cells subsequent to the applying; and
   determining whether the cells pass or fail the erase verify operation based on whether respective threshold voltages of the cells are below or above an erase verify level.

2. The method of claim 1, wherein the erasing, applying, performing, and determining are performed by circuitry that is included within a same integrated circuit as the non-volatile memory.

3. The method of claim 1, wherein the erasing, applying, performing, and determining are performed by circuitry that is included in a test circuit.

4. The method of claim 1, wherein the erasing, applying, performing, determining, and programming are performed during burn-in of an integrated circuit that includes the non-volatile memory.

5. The method of claim 1, wherein the programming and the erasing further comprise:
   programming first cells of the memory array to a digital zero;
   programming second cells of the memory array to a digital zero; and
   erasing the first and second cells to a digital one following the programming the first and second cells.

6. The method of claim 1, wherein the applying further comprises:
   applying a bias stress to a drain or a gate of each of the cells for about 10 milliseconds.

7. The method of claim 1, wherein the applying further comprises:
   applying a first bias stress to a drain of each of the cells; and
   applying a second bias stress to a gate of each of the cells, wherein a value of the first and second bias stresses is different.

8. The method of claim 7, wherein the erase verify level is based on production data, the first bias stress is about 4.2 Volts, and the second bias stress is about 8.5 Volts, and wherein the cells pass the erase verify operation when the respective threshold voltages of the cells are below the erase verify level and fail the erase verify operation when the respective threshold voltages of the cells are above the erase verify level, and the erase verify level has a higher value than a normal erase verify level.

9. The method of claim 1, wherein the applying further comprises:
   applying the bias stress to the cells at a readout cycle.

10. The method of claim 9, wherein the readout cycle corresponds to a predetermined number of program/erase cycles for the memory array.

11. A system, comprising:
    a non-volatile memory; and
    circuitry coupled to the non-volatile memory, wherein the circuitry is configured to erase cells of a memory array of the non-volatile memory to a first state, program the cells to a second state prior to the erasing the cells, apply a bias stress to the cells subsequent to the erasing the cells, perform an erase verify operation on the cells subsequent to the applying a bias stress to the cells, and determine whether the cells pass or fail the erase verify operation based on whether respective voltage thresholds of the cells are below or above an erase verify level.

12. The system of claim 11, wherein the circuitry is included within a same integrated circuit as the non-volatile memory.

13. The system of claim 11, wherein the circuitry is configured to perform a program/erase cycling test of the non-volatile memory during burn-in of an integrated circuit that includes the non-volatile memory at about 125 degrees Celsius.

14. The system of claim 11, wherein the circuitry programs the cells to a digital zero and subsequently erases the cells to a digital one.

15. The system of claim 11, wherein the circuitry applies the bias stress to a drain of each of the cells, a gate of each of the cells, or the bias stress includes a first bias stress that is applied to a drain of each of the cells and a second bias stress that is applied to a gate of each of the cells.

16. The system of claim 11, wherein the erase verify level is dynamic and is based on production data and is higher than a normal erase verify level.

17. The system of claim 11, wherein the circuitry applies the bias stress to the cells at a readout cycle that corresponds to a predetermined number of program/erase cycles for the memory array.

18. A method of detecting a leaky bit in a non-volatile memory, comprising:
    programming cells of a memory array of the non-volatile memory to a digital zero;
    erasing the cells to a digital one subsequent to the programming;
    applying a bias stress to the cells subsequent to the erasing;
    performing an erase verify operation on the cells subsequent to the applying; and
    determining whether the cells pass or fail the erase verify operation based on whether respective threshold voltages of the cells are below or above an erase verify level.

19. The method of claim 18 wherein the performing the erase verify operation comprises using an erase verify level that is dynamic and that is based on production data and that is higher than a normal erase verify level.

20. The method of claim 1 wherein the erasing comprises an erase operation and a pre-bias-stress erase verify operation at a pre-bias-stress erase verify level, wherein the pre-bias-stress erase verify level is different than the erase verify level.

21. The system of claim 11 wherein the erasing the cells of the memory array comprises an erase operation and a pre-bias-stress erase verify operation at a pre-bias-stress erase verify level, wherein the pre-bias-stress erase verify level is different than the erase verify level.

22. A method of detecting a leaky bit in a non-volatile memory, comprising:
    erasing cells of a memory array of the non-volatile memory to a first state;
    applying a bias stress to the cells subsequent to the erasing;
    performing an erase verify operation on the cells subsequent to the applying; and
    determining whether the cells pass or fail the erase verify operation based on whether respective threshold voltages of the cells are below or above an erase verify level, wherein the erase verify level is higher than a normal erase verify level.

* * * * *